US012640749B2

(12) United States Patent
Wang et al.

(10) Patent No.: US 12,640,749 B2
(45) Date of Patent: May 26, 2026

(54) ELECTRONIC DEVICE

(71) Applicant: Infineon Technologies AG, Neubiberg (DE)

(72) Inventors: Wei Wang, Munich (DE); Thiyagu Loganathan, Baldham (DE); Henning Behrmann, Freising (DE); Jörg Schreiner, Fürstenfeldbruck (DE); Jens Rosenbusch, Munich (DE); Rocco Calabro, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 215 days.

(21) Appl. No.: 18/659,418

(22) Filed: May 9, 2024

(65) Prior Publication Data

US 2024/0380409 A1     Nov. 14, 2024

(30) Foreign Application Priority Data

May 10, 2023     (DE) ..................... 10 2023 112 346.7

(51) Int. Cl.
*H03M 1/10* (2006.01)
*H03M 1/12* (2006.01)

(52) U.S. Cl.
CPC ........... *H03M 1/1245* (2013.01); *H03M 1/10* (2013.01)

(58) Field of Classification Search
CPC .... H03M 1/1245; H03M 1/10; H03M 1/1076; H03M 1/06
USPC .......................................... 341/155, 120, 118
See application file for complete search history.

(56) References Cited

U.S. PATENT DOCUMENTS

2011/0057658 A1* 3/2011 Yugou .................... G01R 31/54
                                                        324/426
2014/0129892 A1 5/2014 Magin et al.

* cited by examiner

*Primary Examiner* — Peguy Jean Pierre
(74) *Attorney, Agent, or Firm* — Eschweiler & Potashnik, LLC

(57) ABSTRACT

According to various embodiments, an electronic device is described, comprising a device input for connecting an analog signal source, an analog-to-digital converter having an analog-to-digital converter input connected to the device input, an alternating current source configured to supply an alternating current to the analog-to-digital-converter input and a detection circuit configured to store a reference for an amplitude of a voltage signal at the analog-to-digital-converter input caused by the alternating current, receive an output of the analog-to-digital converter, determine the amplitude of the voltage signal at the analog-to-digital-converter input caused by the alternating current by filtering the output of the analog-to-digital converter and output an error signal if the reference for the amplitude differs from the determined amplitude by more than a predetermined threshold.

20 Claims, 8 Drawing Sheets

700

IDAC current

Time

ELECTRONIC DEVICE

REFERENCE TO RELATED APPLICATIONS

This application claims priority to German Patent Application 10 2023 112 346.7 filed on May 10, 2023, the contents of which are hereby incorporated by reference in their entirety.

FIELD

The present disclosure relates to electronic devices, in particular analog-to-digital converter devices.

BACKGROUND

Electronic devices like analog-to-digital converter devices, e.g., devices providing an analog-to-digital conversion functionality, e.g., for processing an analog sensor signal, may, depending on where they are used, have high requirements regarding their reliability. For example, an electronic control unit in a car having an analog-to-digital converter typically needs to fulfill a high safety standard (such as ASIL (Automotive Safety Integrity Level) D). This in particular includes robustness against errors in connections of various components, like a connection of a sensor to an analog-to-digital converter. While high reliability may be achieved by various approaches, e.g., by providing redundant elements (like two analog-to-digital converters connected separately whose outputs are compared) these approaches increase complexity and thus for example increase required chip area, power consumption, and cost. Accordingly, efficient approaches for detecting errors regarding the operation of electronic devices, in particular connections from signal sources (like sensors) to analog-to-digital converters are desirable.

SUMMARY

According to various embodiments, an electronic device is described, comprising a device input for connecting an analog signal source, an analog-to-digital converter having an analog-to-digital converter input connected to the device input, an alternating current source configured to supply an alternating current to the analog-to-digital-converter input and a detection circuit configured to store a reference for an amplitude of a voltage signal at the analog-to-digital-converter input caused by the alternating current, receive an output of the analog-to-digital converter, determine the amplitude of the voltage signal at the analog-to-digital-converter input caused by the alternating current by filtering the output of the analog-to-digital converter and output an error signal if the reference for the amplitude differs from the determined amplitude by more than a predetermined threshold.

BRIEF DESCRIPTION OF DRAWINGS

In the drawings, similar reference characters generally refer to the same parts throughout the different views. The drawings are not necessarily to scale, emphasis instead generally being placed upon illustrating the principles of the disclosure. In the following description, various aspects are described with reference to the following drawings, in which.

DETAILED DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
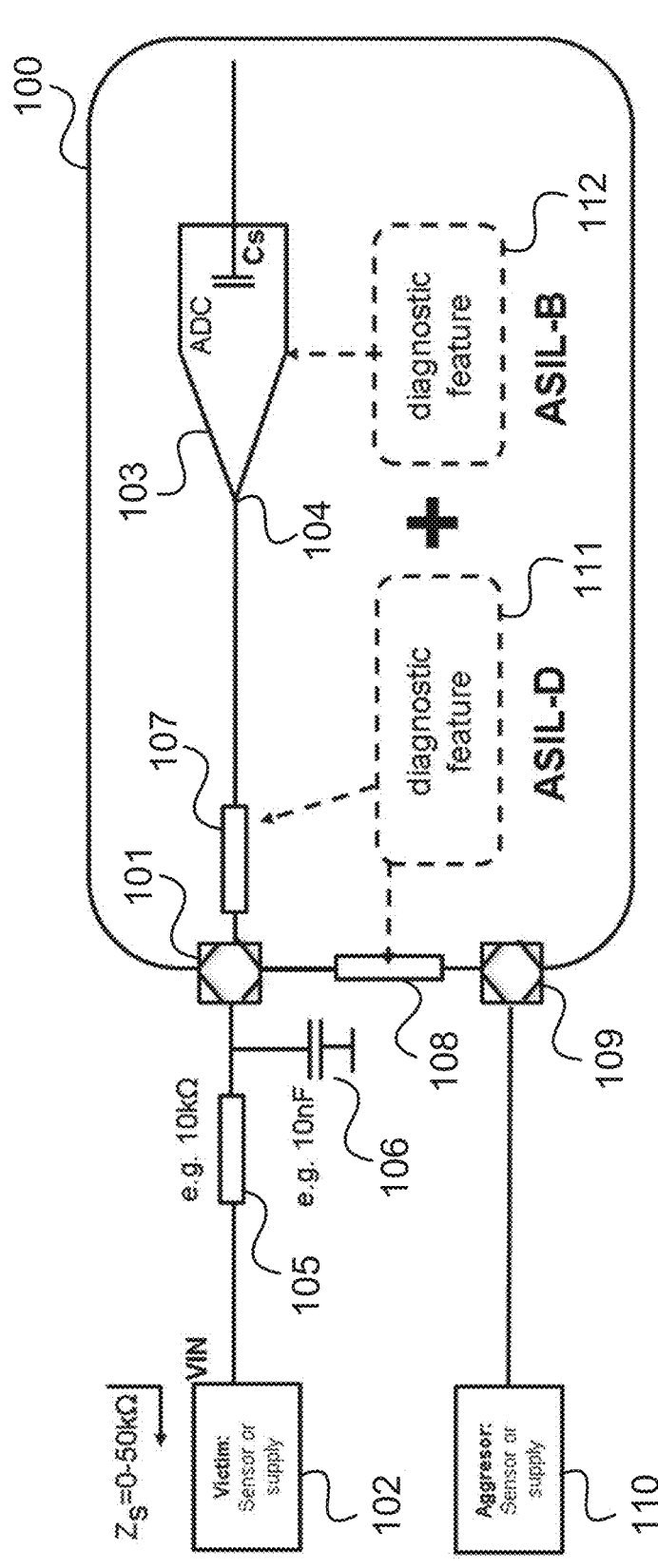
FIG. 1 shows an electronic device.

FIG. 1 shows an electronic device 100.

For example, the electronic device 100 is an electronic control unit (ECU), in particular for a vehicle, but may also be a control unit or a data processing device for other devices such as machines, power generators, etc.

The electronic device 100 has a first input 101, e.g., implemented by a first (e.g., package) input terminal (e.g., pin or pad), via which the electronic device 100 may be connected to a first analog signal source 102, e.g., a sensor or power supply to be monitored (e.g., an analog-to-digital converter is used to monitor (e.g., measure) an external supply rail; when the external supply rail leaves a predetermined (voltage) range, an alarm is triggered). The electronic device 100 comprises an analog-to-digital converter (ADC) 103 for converting analog signals provided by the first analog signal source 102 to a digital signal. Accordingly, the ADC 103 has an ADC input 104 connected to the input 101.

The first analog signal source 102 is connected to the first input 101 via a connection which has a certain resistance 105 and a certain capacity 106. When the ADC 103 is seen as load, this (together with characteristics of the first analog signal source 102) gives rise to an output impedance of the first analog signal source 102.

From the point of view of the ADC input 104, the ADC input 104 "sees" an impedance which depends on the resistance 105, the capacitance 106 and an impedance $Z_S$ (typically between 0 and 50 k$\Omega$) of the first analog signal source 102, e.g., the ADC input 104 sees, in the direction of the first analog signal source 102, a certain input impedance $Z_{in}$.

Errors (which change $Z_{in}$) may occur with respect to the connection of the first analog signal source 102 to the ADC input 104, which should be detectable, e.g., to fulfill ASIL-D:

The connection between the first analog signal source 102 and the ADC input 104 may have a line resistance increase (represented by a second resistor 107) from its nominal value (which may be close to zero). For example, an increase of $Z_{in}$ by 10% $Z_S$ (or 100Ω if $Z_S$=0 should be detectable).

There may be an electric connection (e.g., a lack of isolation, e.g., a short circuit), represented by a third resistor 108, to a second input 109 (e.g., a second input pin) via which, for example, a second analog signal source 110 is or can be connected. For example, such a connection of 500 kΩ or lower or even of 1 MΩ or lower should be detectable.

It should be noted that functional safety in view of such errors in the connection of an analog signal source to an ADC (or errors arising from such connection errors) may be achieved by providing redundancy, e.g., by providing two ADCs with separate connections. However, this increases the number of required inputs (e.g., input pins) and the required circuitry (and thus e.g., chip area). Further, while a diagnostic mechanism 111 like CSD (Core Self Diagnostic) and BWD (Broken Wire Detection) may be used for an ADC, this may (without redundancy) not be sufficient to achieve high functional safety requirements like ASIL-D (but e.g., only ASIL-B).

Therefore, embodiments may provide a high safety diagnostic mechanism 112 to achieve a required level of functional safety.

Figure 2:
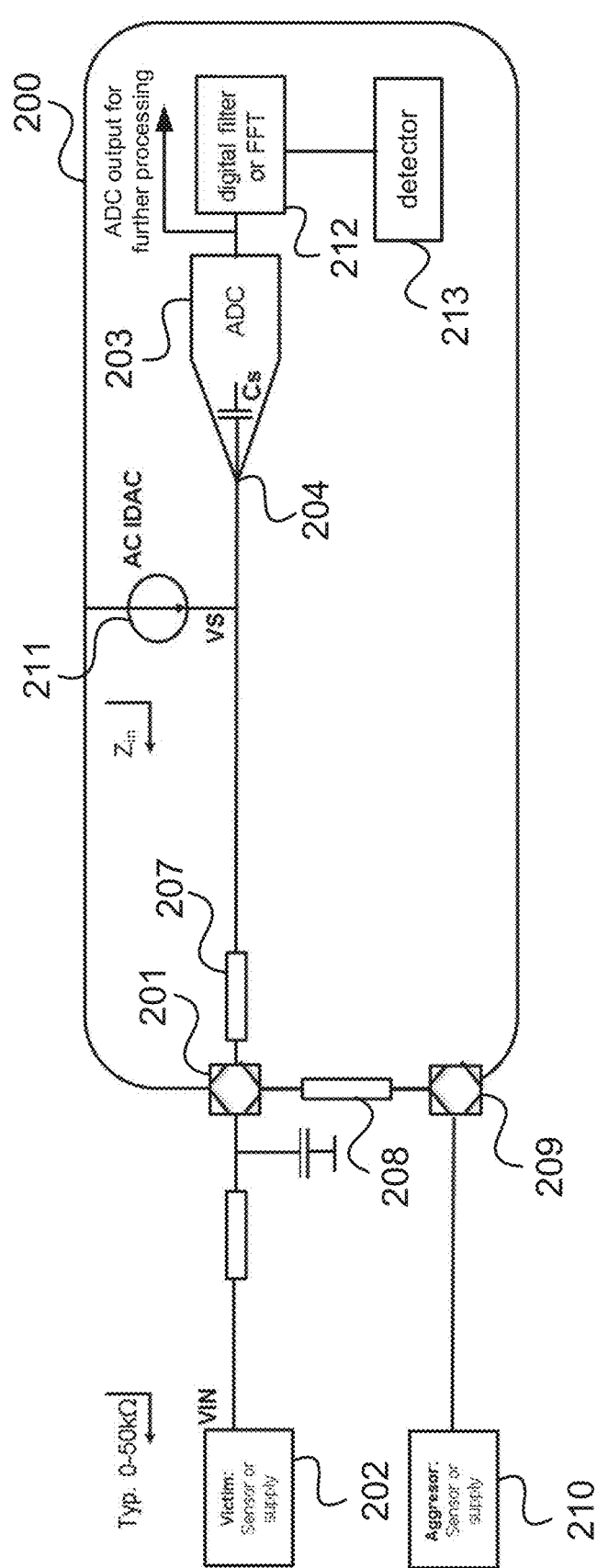
FIG. 2 shows an electronic device comprising a diagnostic mechanism according to an embodiment.

FIG. 2 shows an electronic device 200 comprising a diagnostic mechanism according to an embodiment.

Similarly to the electronic device 100 of FIG. 1, the electronic device 200 is for example an electronic control unit (ECU), in particular for a vehicle, but may also be a control unit or a data processing device for other devices such as machines, power generators, etc.

As described with reference to FIG. 1, the electronic device 200 similarly comprises two inputs 201, 209 to connect analog signal sources 202, 210, an ADC 203 with an (ADC) input 204 and errors represented by resistors 207, 208 should be detected.

For this detection, an alternating current (AC) source, in this example an AC IDAC (current digital-to-analog converter) 211 is provided. Its output is connected to the ADC input 204. As mentioned above, AC IDAC 211 sees, as a power source, in the direction of the first analog signal source 202 an input impedance $Z_{in}$ (which is, from the point of view of the AC IDAC 211, a load impedance $Z_L$) which changes if one or both of the errors represented by resistors 207, 208 occurs.

According to various embodiments, this fact is used for detecting one or both of the errors represented by resistors 207, 208. Specifically, the voltage at the ADC input 204 caused by the alternating current provided by the AC IDAC 211 is monitored. This is done by performing AD conversion of the voltage at the ADC input 204 and determining the amplitude of the component VRES_FILTERED of this voltage which corresponds to the frequency $f_{IDAC}$ of the current $I_{IDAC}$ provided by the AC IDAC 211. Determining this component may be done using a digital (e.g., bandpass) filter applied to the output of the ADC 203 or by Fourier analysis (e.g., performing FFT) on the output of the ADC 203. The operation of extracting the digitized voltage component of the ADC input voltage is represented by a filter or FFT block 212 in FIG. 2. The errors represented by resistors 207, 208 may be detected, e.g., by a detector 213, based on VRES_FILTERED for which $$VRES\_FILTERED = I_{IDAC} * Z_{in}$$

holds.

Specifically, the errors represented by resistors 207, 208 may be detected as follows:

A reference for VRES_FILTERED is determined (and/or defined) and e.g., stored in the detector 213. This reference may for example be determined by a formula, by means of a look-up table and/or an initial measurement (e.g., a measurement when it can be ensured that both errors represented by resistors 207, 208 have not occurred). It is for example an option to determine the reference by means of an initial measurement and check whether the measurement is plausible by comparing it with the value given by a formula and/or look-up table (e.g., determining from $Z_{in}$ (without errors) from a look-up table and determine the reference from VRES_FILTERED=$I_{IDAC}*Z_{in}$.

VRES_FILTERED is then repeatedly (e.g., periodically, continuously or in response to a test command) determined and the detector 213 checks whether the determined VRES_FILTERED is within a predetermined tolerance (e.g., 10% or another (low) percentage or absolute value) of the reference for VRES_FILTERED. If it is not within a predetermined tolerance, the detector 213 considers this as one or both of the errors represented by resistors 207, 208 having occurred and for example outputs an error (or alarm) signal which for example triggers a security mechanism (such as entry into a safe mode).

It should be noted that at the ADC output a low-pass filter may be provided (not shown in FIG. 2) which removes the effect of $I_{IDAC}$ to get the "clean" digitized signal provided by the analog signal source 202 for further processing.

Figure 3:
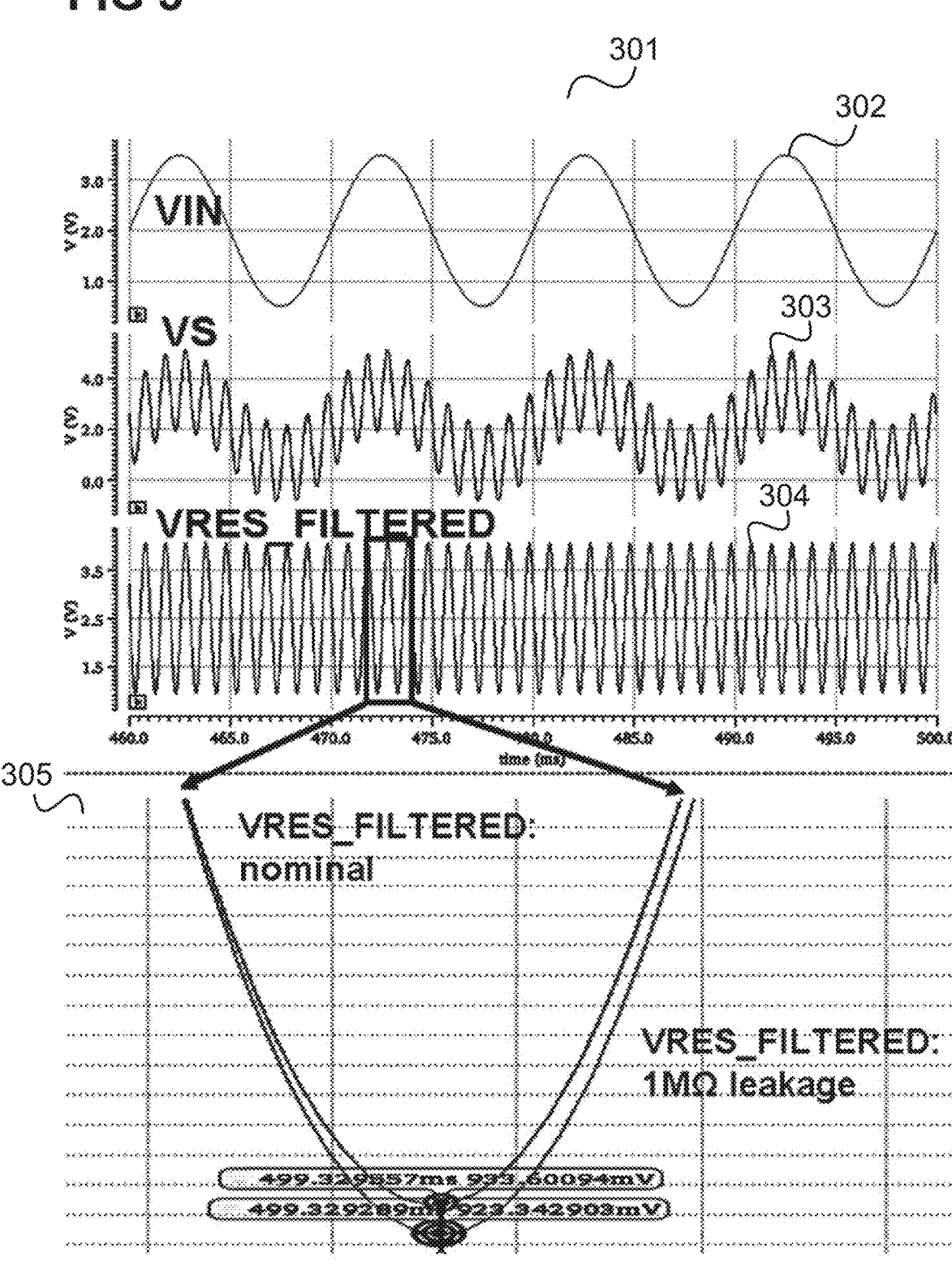
FIG. 3 shows diagrams illustrating examples of signals in the electronic device of FIG. 2.

FIG. 3 shows a first diagram 301 with an example of a voltage signal VIN supplied by the first analog signal source 202 (first curve 302), the voltage signal at the ADC input 204 (second curve 303), which is VIN modulated by a signal with amplitude VRES_FILTERED and frequency f DAC, and the signal with amplitude VRES_FILTERED and frequency $f_{IDAC}$ (third curve 304).

A second diagram 305 shows the change of the amplitude of the signal of the third curve 304 in case of 1 MΩ (e.g., for the case that the second resistor 108 has a value of 1 MΩ), e.g., the change of VRES_FILTERED from its reference. The values in this example are that $Z_S$=0 and that 1 MΩ leakage means a 1% change of $Z_{in}$. In the example shown, the difference between VRES_FILTERED and its reference is 10.26 mV. This means that the detection mechanism is sensitive enough for a 12 bit SAR (Successive-Approximation-Register) ADC in the present exemplary use case.

The example of FIG. 3 may be denoted as "supply (e.g., sensor) short to (neighboring) supply (e.g., sensor) through 1 MΩ". Similarly, a line impedance increase (e.g., a value of the first resistor 107 above 0Ω) may be detected. For example, a difference between VRES_FILTERED and its reference is above 12 mV can be observed for $Z_S$=00 and a value of 1000 of the first resistor 107 as well as for $Z_S$=50 kΩ and a 10% impedance increase of $Z_{in}$.

Figure 4:
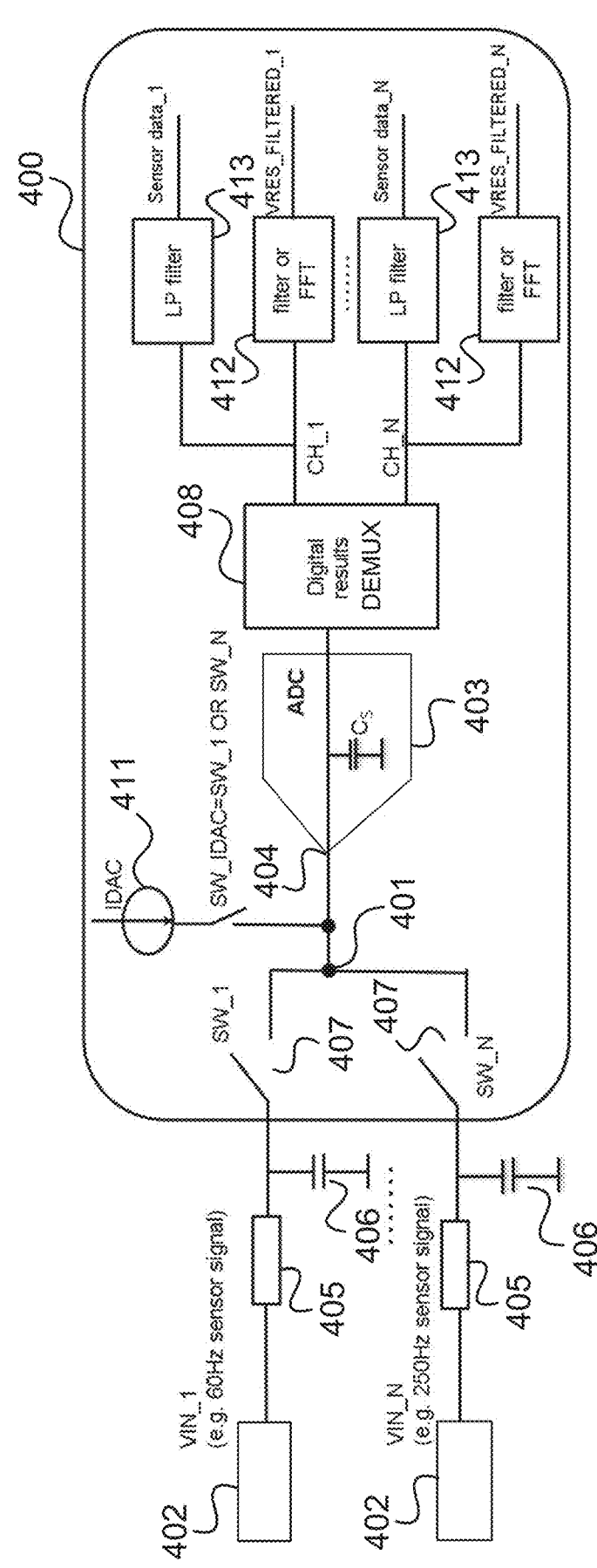
FIG. 4 shows an electronic device comprising a diagnostic mechanism for detecting errors with respect to multiple analog signal sources.

FIG. 4 shows an electronic device 400 comprising a diagnostic mechanism for detecting errors with respect to multiple analog signal sources.

In contrast to the example of FIG. 2, there are now multiple analog signal sources 402 which may be connected to a node 401 via respective switches 407 and a respective connection line or network having a respective resistance 405 and capacity 406.

For, example, each switch 407 is connected on one side to a respective input terminal of the electronic device and on the other side to the node 401. The node 401 is connected (or is) the input node 404 of an ADC 403 and an AC IDAC 411 is, like in FIG. 2, connected to the input node 404 of the ADC 403.

To detect errors with respect to each of the analog signal sources 402 (e.g., for each of the analog signal sources 402, a short circuit to one of the others or an impedance increase of its connection to the ADC), the results of the ADC are separated by a de-multiplexer 408 according to multiple channels, wherein, in this example, a filter (or FFT) 412 is provided to provide the voltage at the ADC input 404 caused by the alternating current provided by the AC IDAC 411 and, for each channel, a low-pass filter 413 which removes the effect of $I_{IDAC}$ to get the "clean" digitized signal provided by the respective analog signal source 402. Each channel is associated with a respective one of the analog signal sources 402.

For example, errors are detected for the analog signal sources 402 one after another: The switch 407 for one of the analog signal sources 402 is closed and the others are opened and the de-multiplexer 408 provides the ADC result to the low-pass filter 413 and the filter (or FFT) 412 associated with the analog signal source 402. The error detection can then be done as explained with reference to FIG. 2, e.g., for several cycles of the sampling clock of the ADC 403 switch 407 for one of the analog signal sources 402 is closed and the others are opened and error detection is performed for the analog signal source for which the switch is closed during that ADC clock cycles and after that the switch configuration is changed, e.g., the switch for another of the analog signal sources 402 is opened and the others closed and the de-multiplexer 408 provides the ADC result to another low-pass filter 413 and the filter (or FFT) 412 (wherein, in this example, a single filter (or FFT) 412 may suffice).

In case the frequencies of the signals provided by the analog signal sources 402 are sufficiently different, the output signal of the ADC may also be provided to all low-pass filters 413 (which may in this case be band-pass filters for the respective frequencies). In that case, a joint error detection (e.g., a detection whether an error occurs in any of the connections of the analog signal sources) may be performed (e.g., all analog signal sources 402 are connected (all switches 407 closed) and detection is performed based on the output of a single filter (or FFT) 412 receiving the ADC output signal). A frequency multiplexing in this manner does not sacrifice the ADC data rate (since all channels profit from the full ADC data rate).

Alternatively, the IDAC current $I_{IDAC}$ can be multiplexed in time with high frequency (multiple times per $I_{IDAC}$, e.g., within one level of $I_{IDAC}$ assuming a piece-wise constant form of $I_{IDAC}$), wherein, the sampling times for the analog signal sources 402 (e.g., each channel) are different and the switch 407 is closed for an analog signal source 402 when the ADC 403 samples for the analog signal source. This is described in more detail with reference to FIG. 5.

Figure 5:
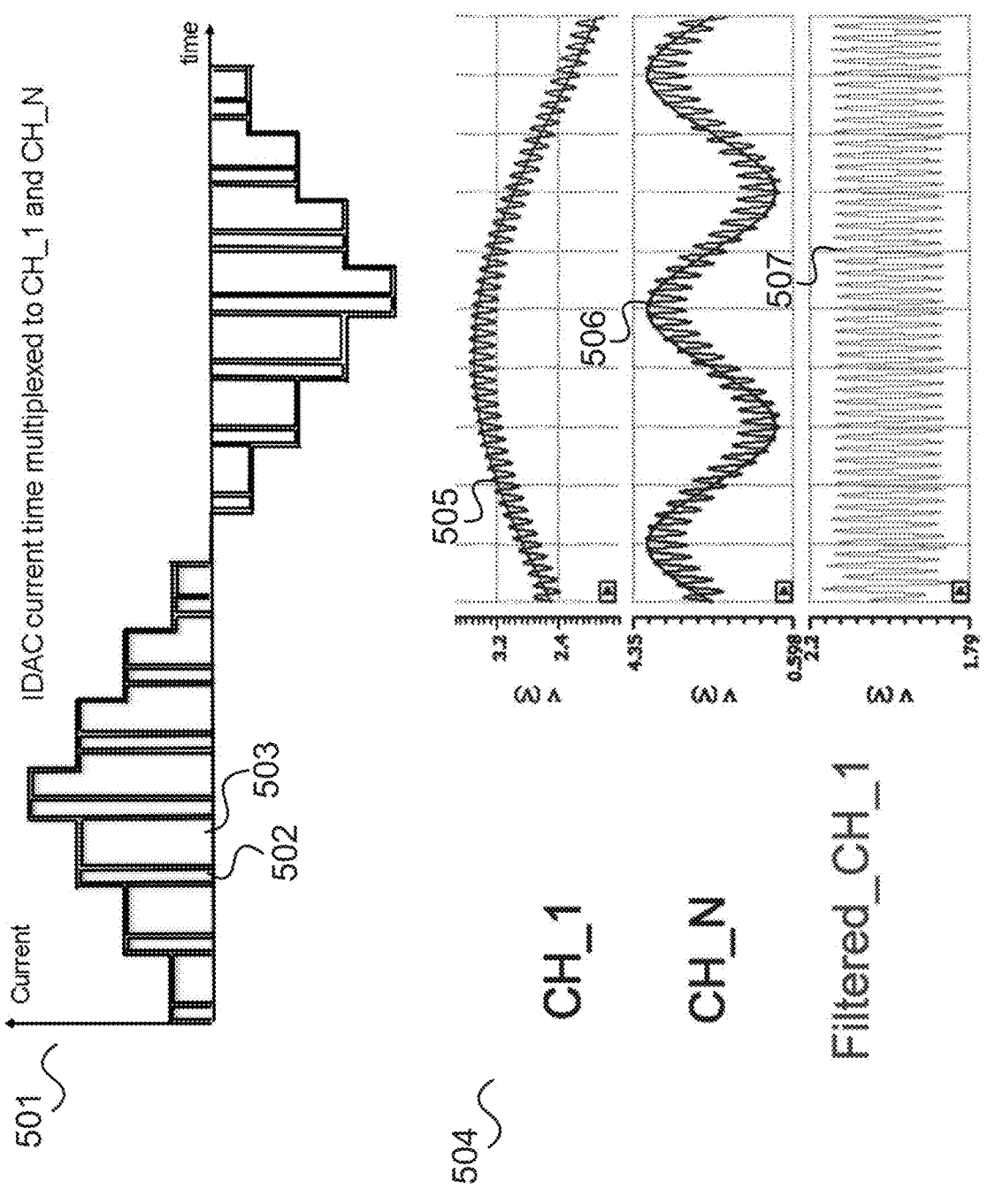
FIG. 5 illustrates a high-frequency time multiplexing for error detection.

FIG. 5 illustrates a high-frequency time multiplexing for error detection.

A first diagram 501 shows the IDAC current $I_{IDAC}$ which has a piece-wise constant form, e.g., it is constant for each of a plurality of time intervals. Each time interval is separated in a first part 502 assigned to a first channel CH_1 and a second part 503 assigned to an n-th channel CH_N (the time interval may be separated in this manner in more than n parts so n can be higher than 2.

In the first part of each time interval, the switch 407 for the analog signal source 402 associated with CH_1 is closed, the ADC samples its input voltage and the de-multiplexer supplies the ADC output to CH_1.

In the second part of each time interval, the switch 407 for the analog signal source 402 associated with CH_N is closed, the ADC samples its input voltage and the de-multiplexer supplies the ADC output to CH_N.

A second diagram 504 illustrates the signal of the analog signal source 402 associated with CH_1 modulated by $I_{DAC}$ (first curve 505) which the ADC samples in the first parts of the time intervals and the signal of the analog signal source 402 associated with CH_N modulated by $I_{DAC}$ (second curve 506) which the ADC samples in the second parts of the time intervals. Further, the filtered ADC output for the CH_1 is shown (third curve 507).

So, all channels can share a single IDAC current through time multiplexing. The modulation amplitude depends on the duty cycle of the time interval parts (since depending on the duty cycle, current is supplied for a longer or shorter time leading to a higher or shorter voltage at the ADC input). All channels can be modulated simultaneously.

Figure 6:
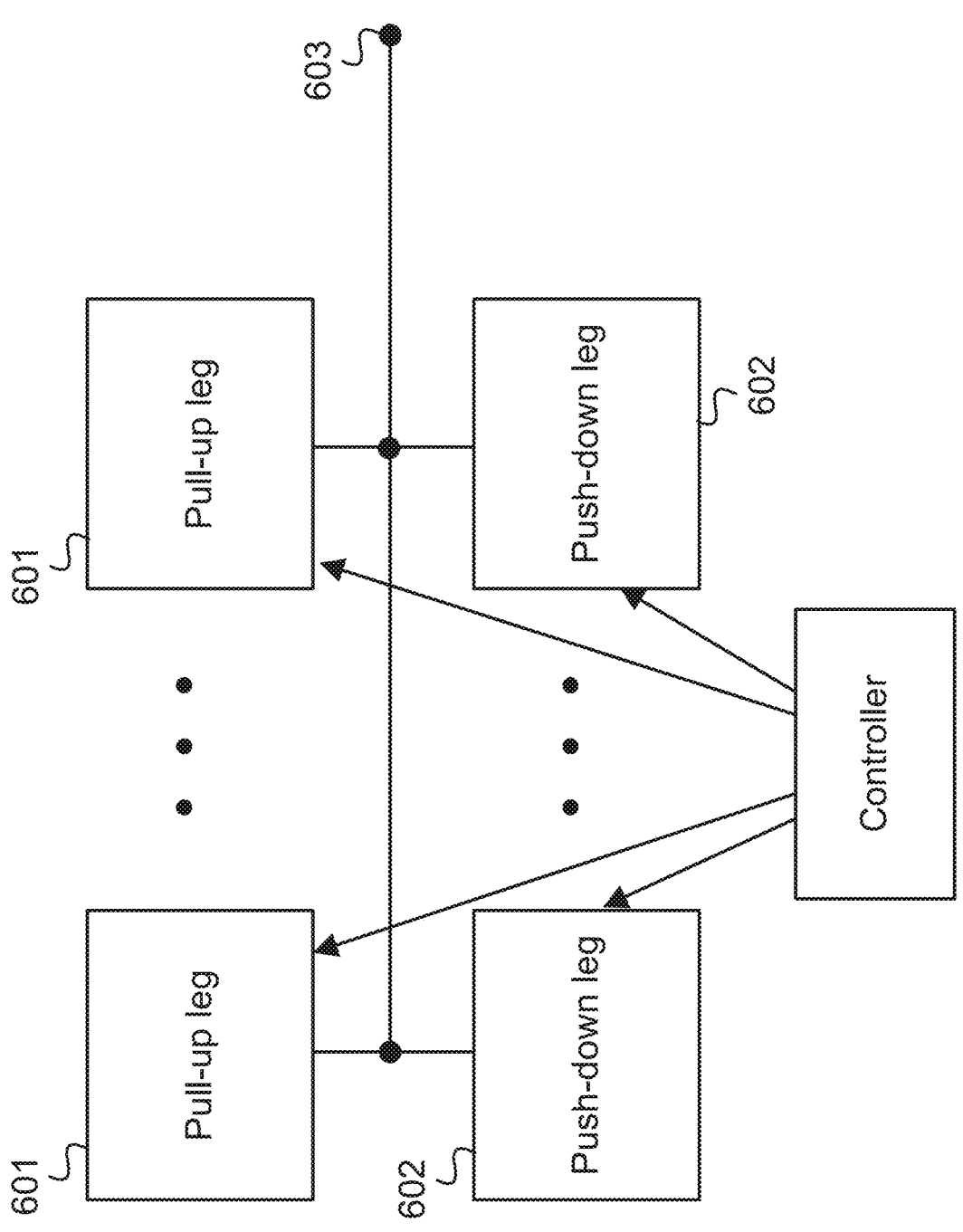
FIG. 6 shows an exemplary implementation of an IDAC (current digital-to-analog converter) according to an embodiment.

FIG. 6 shows an exemplary implementation of an (open-loop) IDAC 600.

An IDAC may be implemented as a plurality of pairs of pull-up leg 601 and push-down leg 602 connected in a parallel manner, e.g., the output of each pair (which is the node of connection of the pull-up leg and the push-down leg) is connected to the IDAC's output 603.

Both the pull-up leg and the push-down leg for example include a current source (e.g., implemented by one or more pull-up transistors or one or more push-down transistors, respectively).

For each pair, the pull-up leg, when activated, increases the output current of the IDAC 300 while the push-down leg, when activated, decreases the output current of the IDAC 300.

A controller 604 receives a digital input value and activates the pull-up legs and the push-down legs of the pairs such that the output current corresponds to the digital input value. For example, each pair corresponds to one bit position of the digital input value and is dimensioned accordingly. Thus, the output current is an analog representation of the digital input value.

By supplying a suitable sequence of digital input values (and thus, in effect, pulse width modulating the pull-up legs and the push-down legs), an approximation of an sinusoidal output current can be generated. This sequence may be coupled to the ADC operation (e.g., one or more ADC operation signals or parameters may define the sequence).

Figure 7:
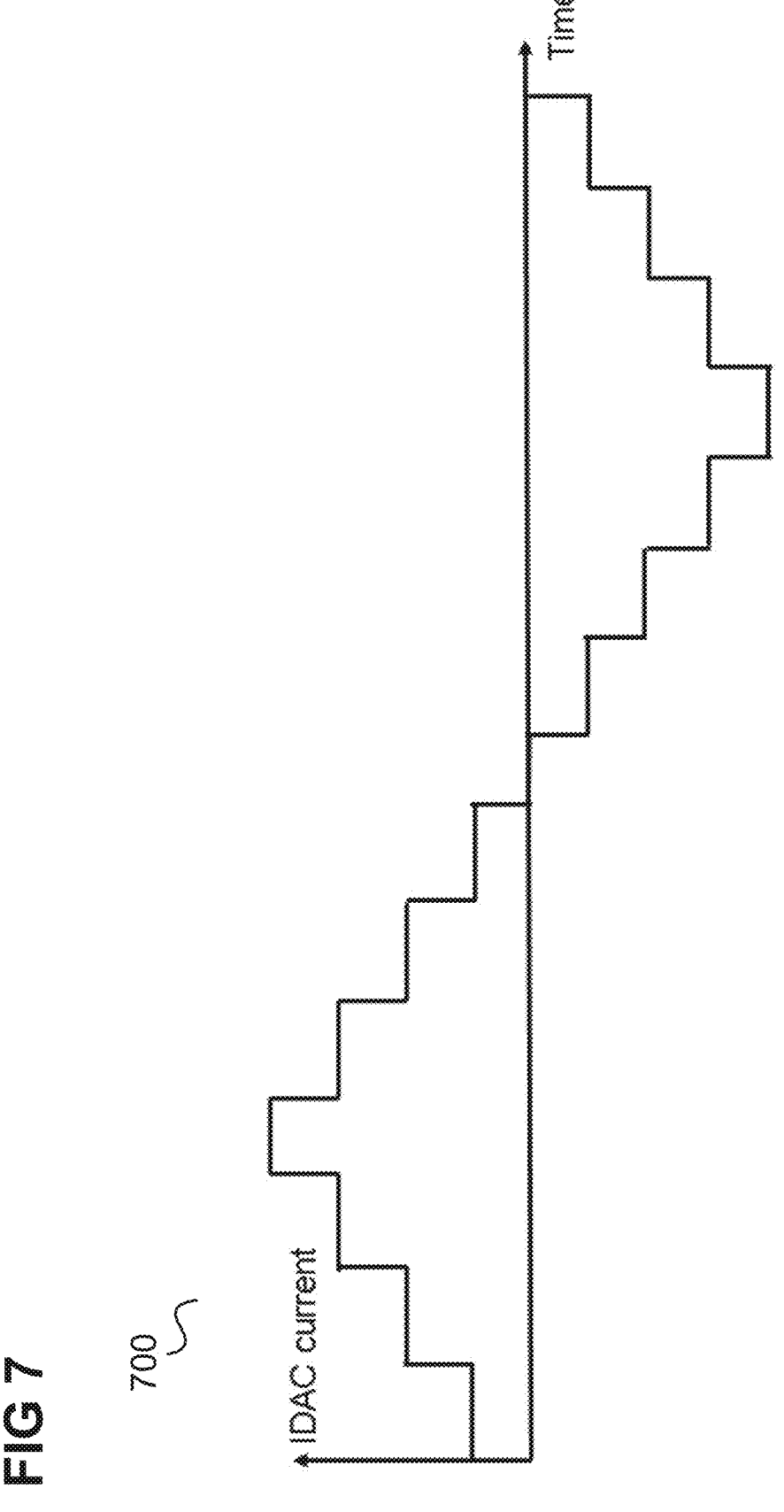
FIG. 7 shows a diagram illustrating an example of an IDAC output current.

FIG. 7 shows a diagram 700 illustrating an example of an IDAC output current.

The IDAC output current is in this example generated by four legs (e.g., each comprising a p-MOS leg and an n-MOS leg). For the highest level, all four pull-up legs are activated and for the lowest level, all five push-down legs are activated.

The number of legs (and thus bits of the digital input value) may be chosen according to the trade-off of complexity and noise injection.

Figure 8:
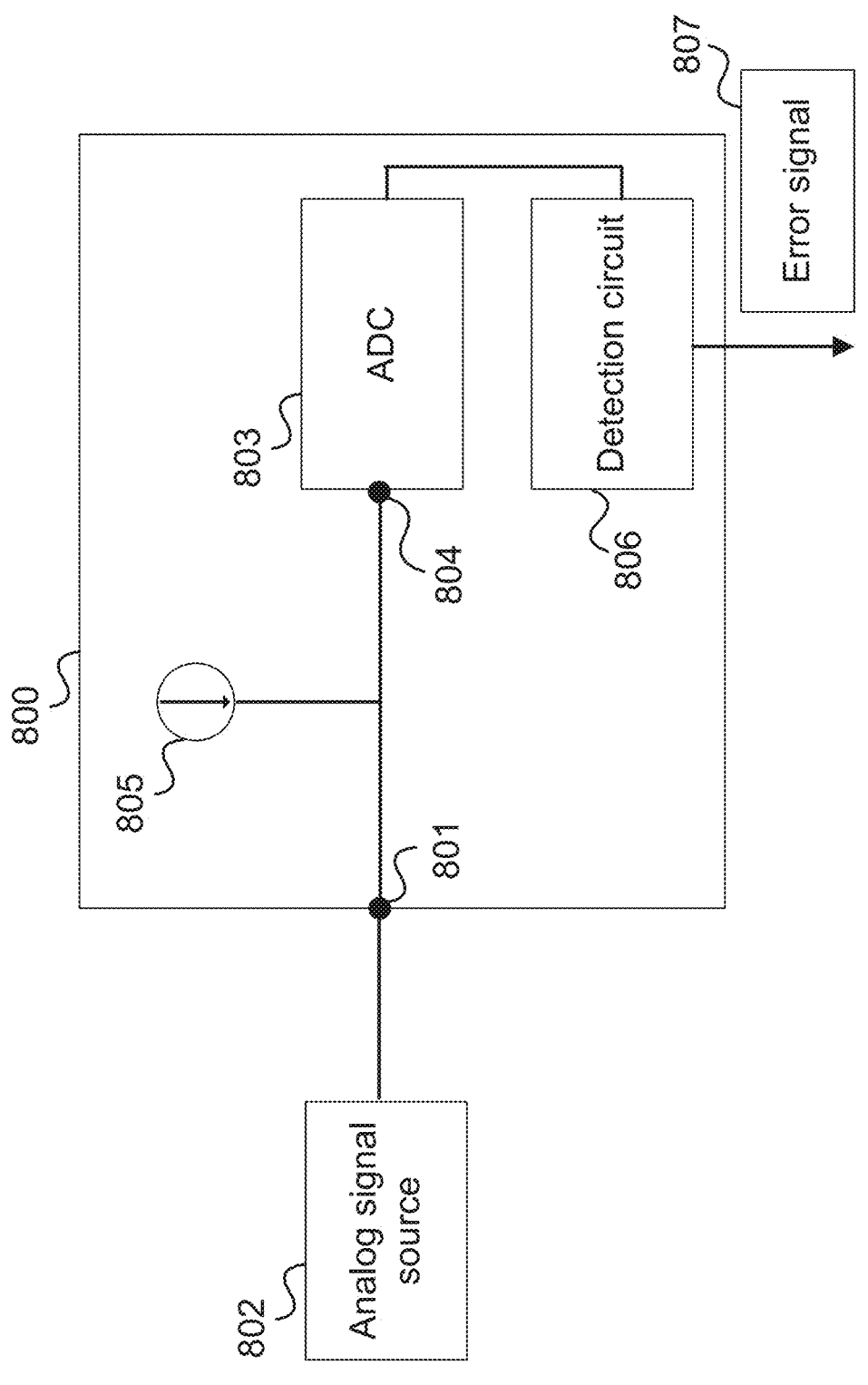
FIG. 8 shows an electronic device according to an embodiment.

In summary, according to various embodiments, an electronic device is provided as illustrated in FIG. 8.

FIG. 8 shows an electronic device 800 according to an embodiment.

The electronic device 800 comprises a device input 801 for connecting an analog signal source 802 and an analog-to-digital converter 803 having an analog-to-digital converter input 804 connected to the device input 801.

The electronic device 800 further comprises an alternating current source 805 configured to supply an alternating current to the analog-to-digital-converter input 804.

Further, the electronic device 800 comprises a detection circuit 806 (e.g., corresponding to the detector and filter or FFT block in the examples above and possibly further components such as a memory like one or more registers) configured to > store a reference for an amplitude of a voltage signal at the analog-to-digital-converter input 804 caused by the alternating current;
>
> receive an output of the analog-to-digital converter 803
>
> determine the amplitude of the voltage signal at the analog-to-digital-converter input 804 caused by the alternating current by filtering the output of the analog-to-digital converter (filtering is here understood to also include performing a spectral (e.g., Fourier) analysis and only taking the frequency component(s) of interest);
>
> output an error signal 807 if the reference for the amplitude differs from the determined amplitude by more than a predetermined threshold (e.g., 10%). The error signal may be processed internally in the electronic device or externally, e.g., by another component of an electronic system (e.g., apparatus or arrangement) of which the electronic device is a component.

According to various embodiments, in other words, an IDAC (current digital to analog converter), for example, provides an AC stimulus for an (input) impedance measurement using the ADC when the ADC is in operation and is connected to external (analog) signal source, e.g., external sensor or power supply, to detect connection errors such as package pin failures.

A reference for the input impedance may be determined from a formula, look-up table and/or initial measurement (e.g., during production test). A characteristic regarding the input impedance determined in this manner may also be used for a plausibility check of the reference.

The alternating current source (e.g., IDAC) has a different frequency (e.g., 1-10 kHz) compared to the analog input signal of the analog signal source. Therefore, the analog input signal is modulated by the IDAC current. After data conversion, the information regarding the error detection and the information in the analog input signal (e.g., sensor information) and can be separated by a digital filter or FFT such that there is no sampling rate loss during the detection.

In case of multiple analog signal sources, a single alternating current source (e.g., IDAC) may be used by using time multiplexing. This saves chip area (and thus cost) compared to an implementation using multiple IDACs.

It should be noted that the alternating current source (e.g., IDAC) may be also connected to the ADC input via a switch (see for example FIG. 4). This switch is for example controlled as follows: when one of the inputs is connected, the switch is closed such that the alternating current source supplies current to the connected input. When all inputs (or, in general, terminals, which may also include output terminals) are disconnected, the voltage at the ADC input should not be changed to convert the respective analog voltage to digital (e.g., for measuring).

Various Examples are described in the following:

Example 1 is an electronic device as described with reference to FIG. 8.

Example 2 is the electronic device of example 1, wherein the alternating current source is configured to generate the alternating current to have a predetermined frequency.

Example 3 is the electronic device of example 2, wherein the alternating current has a predetermined frequency and the controller is configured to determine the amplitude of the voltage signal at the analog-to-digital-converter input caused by the alternating current by filtering the output of the analog-to-digital converter to determine a frequency component of the output of the analog-to-digital converter which has the predetermined frequency.

Example 4 is the electronic device of any one of examples 1 to 3, wherein the alternating current source is connected to the analog-to-digital-converter input such that a load impedance of the alternating current source depends on an impedance of the connection of the analog-to-digital-converter input to the device input.

Example 5 is the electronic device of any one of examples 1 to 4, wherein the error signal indicates an error of the connection of the analog-to-digital-converter input to the device input.

Example 6 is the electronic device of any one of examples 1 to 5, wherein the device input is implemented by an input terminal of the electronic device.

Example 7 is the electronic device of any one of examples 1 to 6, wherein the electronic device comprises one or more further terminals.

Example 8 is the electronic device of examples 7, wherein the error signal indicates an error of an isolation between the input terminal and the one or more further terminals.

Example 9 is the electronic device of any one of examples 1 to 8, wherein the electronic devices comprises a plurality of device inputs including the device input, wherein the electronic circuit comprises, for each respective device input of the plurality of device inputs a respective switch to connect and disconnect the respective device input to and from the analog-to-digital converter input and wherein the detection circuit is configured to, for each respective device input of the plurality of device inputs, to > store a reference for an amplitude of a voltage signal at the analog-to-digital-converter input caused by the alternating current for the case that the respective device input is connected to the analog-to-digital converter input and the other device inputs of the plurality of device inputs are disconnected from the analog-to-digital converter input;
>
> receive an output of the analog-to-digital converter when the respective device input is connected to the analog-to-digital converter input and the other device inputs of the plurality of device inputs are disconnected from the analog-to-digital converter input;
>
> determine the amplitude of the voltage signal at the analog-to-digital-converter input caused by the alternating current by filtering a respective output of the analog-to-digital converter received from the analog-to-digital converter; and
>
> output an error signal if the reference for the amplitude differs from the determined amplitude by more than a respective predetermined threshold.

Example 10 is the electronic device of example 9, wherein each device input of the plurality of device inputs is for connecting a respective analog signal source.

Example 11 is the electronic device of any one of example 9 or 10, comprising a controller configured to, for an association of each respective device input of the plurality of device inputs with a respective time interval of a sequence of time intervals and, for each time interval of the sequence of time intervals, connect the device input associated with the time interval to the analog-to-digital circuit and disconnect the other device inputs of the plurality of device inputs from the analog-to-digital circuit during the time interval.

Example 12 is the electronic device of example 11, comprising a de-multiplexer configured to separating the output of the analog-to-digital converter into a plurality of channels including a channel for each device input of the plurality of device inputs, wherein the de-multiplexer is configured to, for each time interval of the sequence of time intervals, supply the output of the analog-to-digital converter during the time interval to the channel for the device input associated with the time interval and wherein the detection circuit is configured to determine, for each device input, the amplitude of the voltage signal at the analog-to-digital-converter input caused by the alternating current by filtering the output of the analog-to-digital converter supplied to the channel associated with the device input.

Example 13 is the electronic device of any one of examples 1 to 12, wherein filtering the output of the analog-to-digital converter comprises applying a digital filter to the output which is configured to block frequency components which do not correspond to the alternating current or performing spectral analysis of the output and discarding frequency components which do not correspond to the alternating current.

Example 14 is the electronic device of any one of examples 1 to 13, wherein the alternating current source is a current digital-to-analog converter.

Example 15 is the electronic device of example 14, wherein the current digital-to-analog converter is implemented by a plurality of parallel leg pairs, each leg pair comprising a pull-up leg and a push-down leg which are activated and deactivated according to a digital input value to the digital-to-analog converter of a sequence of digital input values defining the frequency and amplitude of the alternating current.

Example 16 is an electronic system comprising the electronic device of any one of examples 1 to 15 and the analog signal source connected to the device input, Example 17 is the electronic system of example 16, wherein filtering the output of the analog-to-digital converter comprises filtering the output of the analog-to-digital converter by a filter which lets a frequency component of a frequency of the alternating current pass and blocks frequency components supplied to the device input by the analog signal source.

Example 18 is the electronic system of example 16 or 17, wherein the analog signal source is a sensor.

Example 19 is the electronic system of example 16, comprising a plurality of analog signal sources Example 20 is an electronic system comprising the electronic device of any one of examples 10 to 12 and, for each device input, the respective analog signal source, wherein the analog signal sources are configured to supply signals of different frequencies to the electronic device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. An electronic device, comprising:
a device input for connecting an analog signal source;

10 an analog-to-digital converter having an analog-to-digital-converter input connected to the device input;
an alternating current source configured to supply an alternating current to the analog-to-digital-converter input; and
a detection circuit configured to:
store a reference for an amplitude of a voltage signal at the analog-to-digital-converter input caused by the alternating current;
receive an output of the analog-to-digital converter;
determine the amplitude of the voltage signal at the analog-to-digital-converter input caused by the alternating current by filtering the output of the analog-to-digital converter; and
output an error signal if the reference for the amplitude differs from the determined amplitude by more than a predetermined threshold.

2. The electronic device of claim 1, wherein the alternating current source is configured to generate the alternating current to have a predetermined frequency.

3. The electronic device of claim 2, wherein the alternating current has the predetermined frequency and the detection circuit comprises a controller that is configured to determine the amplitude of the voltage signal at the analog-to-digital-converter input caused by the alternating current by filtering the output of the analog-to-digital converter to determine a frequency component of the output of the analog-to-digital converter which has the predetermined frequency.

4. The electronic device of claim 1, wherein the alternating current source is connected to the analog-to-digital-converter input such that a load impedance of the alternating current source depends on an impedance of a connection of the analog-to-digital-converter input to the device input.

5. The electronic device of claim 1, wherein the error signal indicates an error of a connection of the analog-to-digital-converter input to the device input.

6. The electronic device of claim 1, wherein the device input is implemented by an input terminal of the electronic device.

7. The electronic device of claim 6, wherein the electronic device comprises one or more further terminals.

8. The electronic device of claim 7, wherein the error signal indicates an error of an isolation between the input terminal and the one or more further terminals.

9. The electronic device of claim 1, wherein the electronic device comprises a plurality of device inputs including the device input, wherein the electronic device comprises, for each respective device input of the plurality of device inputs a respective switch to connect and disconnect the respective device input to and from the analog-to-digital-converter input and wherein the detection circuit is configured to, for each respective device input of the plurality of device inputs, to
store a reference for an amplitude of a voltage signal at the analog-to-digital-converter input caused by the alternating current when the respective device input is connected to the analog-to-digital-converter input and other device inputs of the plurality of device inputs are disconnected from the analog-to-digital-converter input;
receive an output of the analog-to-digital converter when the respective device input is connected to the analog-to-digital-converter input and the other device inputs of the plurality of device inputs are disconnected from the analog-to-digital-converter input;

determine the amplitude of the voltage signal at the analog-to-digital-converter input caused by the alternating current by filtering a respective output of the analog-to-digital converter received from the analog-to-digital converter; and output an error signal if the reference for the amplitude differs from the determined amplitude by more than a respective predetermined threshold.

10. The electronic device of claim 9, wherein each device input of the plurality of device inputs is configured to connect a respective analog signal source.

11. An electronic system comprising the electronic device of claim 10, further comprising: for each device input a respective analog signal source, wherein the analog signal sources are configured to supply signals of different frequencies to the electronic device.

12. The electronic device of claim 9, further comprising a controller configured to, form an association with each respective device input of the plurality of device inputs with a respective time interval of a sequence of time intervals and, for each time interval of the sequence of time intervals, connect a device input associated with the time interval to the analog-to-digital converter and disconnect other device inputs of the plurality of device inputs from the analog-to-digital converter during the time interval.

13. The electronic device of claim 12, further comprising a de-multiplexer configured to separate the output of the analog-to-digital converter into a plurality of channels including a channel for each device input of the plurality of device inputs, wherein the de-multiplexer is configured to, for each time interval of the sequence of time intervals, supply the output of the analog-to-digital converter during the time interval to the channel for the device input associated with the time interval, and wherein the detection circuit is configured to determine, for each device input, the amplitude of the voltage signal at the analog-to-digital-converter input caused by the alternating current by filtering the output of the analog-to-digital converter supplied to the channel associated with the device input.

14. The electronic device of claim 1, wherein filtering the output of the analog-to-digital converter comprises: applying a digital filter to the output which is configured to block frequency components which do not correspond to the alternating current, or performing spectral analysis of the output and discarding frequency components which do not correspond to the alternating current.

15. The electronic device of claim 1, wherein the alternating current source is a current digital-to-analog converter.

16. The electronic device of claim 15, wherein the current digital-to-analog converter is implemented by a plurality of parallel leg pairs, each leg pair comprising a pull-up leg and a push-down leg which are activated and deactivated according to a digital input value to the current digital-to-analog converter of a sequence of digital input values defining a frequency and amplitude of the alternating current.

17. An electronic system comprising the electronic device of claim 1 and the analog signal source connected to the device input.

18. The electronic system of claim 17, wherein filtering the output of the analog-to-digital converter comprises filtering the output of the analog-to-digital converter by a filter which lets a frequency component of a frequency of the alternating current pass and blocks frequency components supplied to the device input by the analog signal source.

19. The electronic system of claim 18, wherein the analog signal source is a sensor.

20. The electronic system of claim 17, comprising a plurality of analog signal sources.

* * * * *